(12) United States Patent
Du et al.

(10) Patent No.: US 11,765,944 B2
(45) Date of Patent: Sep. 19, 2023

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventors: Xiao Du, Hubei (CN); Huai Zhang, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 329 days.

(21) Appl. No.: 17/266,594

(22) PCT Filed: Dec. 28, 2020

(86) PCT No.: PCT/CN2020/140169
§ 371 (c)(1),
(2) Date: Feb. 7, 2021

(87) PCT Pub. No.: WO2022/116327
PCT Pub. Date: Jun. 9, 2022

(65) Prior Publication Data
US 2022/0399415 A1 Dec. 15, 2022

(30) Foreign Application Priority Data
Dec. 3, 2020 (CN) .......................... 202011410528.8

(51) Int. Cl.
*H01L 27/32* (2006.01)
*H01L 51/56* (2006.01)
(Continued)

(52) U.S. Cl.
CPC ......... *H10K 59/124* (2023.02); *H10K 50/813* (2023.02); *H10K 71/00* (2023.02);
(Continued)

(58) Field of Classification Search
CPC .......................... H10K 59/124; H10K 77/111
See application file for complete search history.

(56) References Cited

U.S. PATENT DOCUMENTS

| 10,937,987 B1* | 3/2021 | Guillou | H10K 50/813 |
| 2015/0001477 A1* | 1/2015 | Namkung | H10K 59/124 |
| | | | 257/40 |

(Continued)

FOREIGN PATENT DOCUMENTS

| CN | 104282721 | 1/2015 |
| CN | 108598122 | 9/2018 |

(Continued)

OTHER PUBLICATIONS

Machine translation, Leng, Chinese Pat. Pub. No. CN-108666441-A, translation date: Feb. 24, 2023, Clarivate Analytics, all pages. (Year: 2023).*

(Continued)

*Primary Examiner* — Victoria K. Hall

(57) ABSTRACT

A display panel, comprising a first display portion and at least one curved second display portion disposed on at least one side of the first display portion. The display panel further comprises: an array substrate; and a planarization layer, an anode layer, a pixel definition layer, a light-emitting layer, a cathode layer and an encapsulation layer sequentially disposed on the array substrate. The planarization layer comprises a plurality of first surfaces and a plurality of second surfaces, each of the plurality of second surfaces comprises a first end arranged close to the first display portion and a second end arranged away from of the first display portion, a vertical distance between the first end and a bottom of the planarization layer is less than a vertical distance between the second end and the bottom of the planarization layer.

17 Claims, 7 Drawing Sheets

(51) Int. Cl.
*H01L 51/52* (2006.01)
*H10K 59/124* (2023.01)
*H10K 50/813* (2023.01)
*H10K 71/00* (2023.01)
*H10K 77/10* (2023.01)
*H10K 59/122* (2023.01)
*H10K 59/12* (2023.01)
*H10K 59/80* (2023.01)

(52) U.S. Cl.
CPC ........ *H10K 77/111* (2023.02); *H10K 59/1201* (2023.02); *H10K 59/122* (2023.02); *H10K 59/80515* (2023.02)

(56) References Cited

U.S. PATENT DOCUMENTS

| | | | |
|---|---|---|---|
| 2016/0226013 A1* | 8/2016 | Liu | H10K 59/353 |
| 2017/0287997 A1* | 10/2017 | Park | H10K 77/111 |
| 2018/0190923 A1* | 7/2018 | Heo | H10K 50/822 |
| 2019/0163006 A1* | 5/2019 | Lu | G02F 1/134336 |
| 2019/0181365 A1* | 6/2019 | Choi | H10K 50/86 |
| 2019/0334102 A1* | 10/2019 | Fan | H10K 50/11 |
| 2021/0065588 A1* | 3/2021 | Zhang | G09F 9/301 |

FOREIGN PATENT DOCUMENTS

| | | | | |
|---|---|---|---|---|
| CN | 108666441 A | * | 10/2018 | ........ H01L 27/3244 |
| CN | 108987450 | | 12/2018 | |
| CN | 108987450 A | * | 12/2018 | ........... H10K 50/805 |
| CN | 110010646 | | 7/2019 | |
| CN | 110164952 | | 8/2019 | |
| CN | 110164952 A | * | 8/2019 | ............. H10K 59/12 |
| CN | 110828535 | | 2/2020 | |
| CN | 110828535 A | * | 2/2020 | ............. H10K 59/12 |
| CN | 111129098 | | 5/2020 | |
| CN | 111129098 A | * | 5/2020 | ............. H10K 50/00 |
| CN | 111430416 | | 7/2020 | |
| CN | 111430416 A | * | 7/2020 | ......... H10K 59/1213 |
| CN | 111477108 | | 7/2020 | |
| CN | 111477108 A | * | 7/2020 | ............. G09F 9/301 |
| CN | 111554717 | | 8/2020 | |
| CN | 111554717 A | * | 8/2020 | ............. H10K 59/38 |
| KR | 10-2017-0113924 | | 10/2017 | |

OTHER PUBLICATIONS

Machine translation, Cui, Chinese Pat. Pub. No. CN-111129098-A, translation date: Feb. 20, 2023, Espacenet, all pages. (Year: 2023).*
Machine translation, Liang, Chinese Pat. Pub. No. CN-108987450-A, translation date: Feb. 20, 2023, Espacenet, all pages. (Year: 2023).*
Machine translation, Luo, Chinese Pat. Pub. No. CN-110828535-A, translation date: Feb. 20, 2023, Espacenet, all pages. (Year: 2023).*
Machine translation, Meng, Chinese Pat. Pub. No. CN-110164952-A, translation date: Feb. 20, 2023, Espacenet, all pages. (Year: 2023).*
Machine translation, Yan, Chinese Pat. Pub. No. CN-111477108-A, translation date: Feb. 20, 2023, Espacenet, all pages. (Year: 2023).*
Machine translation, Ye, Chinese Pat. Pub. No. CN-111430416-A, translation date: Feb. 20, 2023, Espacenet, all pages. (Year: 2023).*
Machine translation, Zuo, Chinese Pat. Pub. No. CN-111554717-A, translation date: Feb. 20, 2023, Espacenet, all pages. (Year: 2023).*
International Searching Authority, Written Opinion of the International Searching Authority, International application No. PCT/CN2020/140169, dated Jul. 26, 2021, all pages. (Year: 2021).*
International Searching Authority, Machine translation of the Written Opinion of the International Searching Authority, International application No. PCT/CN2020/140169, dated Jul. 26, 2021, all pages. (Year: 2021).*
International Searching Authority, English Translation, International Search Report, International application No. PCT/CN2020/140169, dated Jul. 26, 2021, all pages. (Year: 2021).*

* cited by examiner

DISPLAY PANEL AND MANUFACTURING METHOD THEREOF

RELATED APPLICATIONS

This application is the national phase of PCT Patent Application No. PCT/CN2020/140169 having the international filing date of Dec. 28, 2020, which claims the benefit of priority of Chinese Patent Application No. 202011410528.8 filed on Dec. 3, 2020. The contents of the above applications are all incorporated by reference herein in their entirety.

FIELD OF THE INVENTION

The present invention relates to the field of display technologies, and in particular to a display panel and a method of manufacturing the same.

With rapid development of display technologies, in order to meet requirements of different users, various types of display panels have gradually entered the market.

Flexible display panels have been widely used due to their bendable characteristics. For example, for some flexible display panels, an edge display region is often set as a bending region, and the bending region is bent or bent to a side of a display panel to form a curved display region to achieve a side display effect.

However, for the display panel with the curved display region, when a viewer looks at the display panel, there is a color difference between the curved display region and a flat display region due to different viewing angles of the curved display region and the flat display region viewed by the viewer. That is, there is a color shift between the curved display region and the flat display region, which results in different display effects in the curved display region and the flat display region, and affects user experience.

Therefore, it is necessary to propose a new technical solution to solve the above technical problems.

SUMMARY OF THE INVENTION

Embodiments of the present invention provide a display panel and a method of manufacturing same, which are used to alleviate a problem of color shift between a curved display portion and a flat display portion caused by different viewing angles.

An embodiment of the present invention provides a display panel that includes a first display portion and at least one second display portion, the second display portion is disposed on at least one side of the first display portion, and the display panel further includes:

an array substrate;

a planarization layer disposed on the array substrate, wherein the planarization layer includes a first surface and a second surface, the second surface includes a first end arranged close to the first display portion and a second end arranged away from of the first display portion, a distance between the first end and a bottom of the planarization layer is less than a distance between the second end and the bottom of the planarization layer, the first surface is a surface of a portion where the planarization layer corresponds to a first sub-pixel in the first display portion, and the second surface is a surface of a portion where the planarization layer corresponds to a second sub-pixel in the second display portion;

an anode layer disposed on the first surface and the second surface of the planarization layer;

a pixel definition layer disposed on the planarization layer, wherein the pixel definition layer includes a plurality of openings, and positions of the openings correspond to a position of the anode layer;

a light-emitting layer disposed in the openings;

a cathode layer covering the pixel definition layer and the light-emitting layer; and an encapsulation layer disposed on the cathode layer.

In the display panel according to an embodiment of the present invention, the first display portion is a flat display portion, and the second display portion is a curved display portion or an inclined display portion having an included angle with the flat display portion.

In the display panel according to an embodiment of the present invention, a distribution density of the first sub-pixel projected on a plane corresponding to the first display portion is equal to or substantially equal to a distribution density of the second sub-pixel projected on the plane corresponding to the first display portion.

In the display panel according to an embodiment of the present invention, the second surface is arranged parallel or substantially parallel to the first surface.

In the display panel according to an embodiment of the present invention, a straight line passing through the second end and defined perpendicular to the bottom of the planarization layer includes an included angle with the second surface, and the included angle gradually decreases in a direction from the first display portion to the second display portion.

In the display panel according to an embodiment of the present invention, the included angle ranges from 0 degree to 90 degrees.

In the display panel according to an embodiment of the present invention, a difference between any adjacent two of the included angles is less than 30 degrees.

In the display panel according to an embodiment of the present invention, each of the second display portion is positioned on both sides of the first display portion.

In the display panel according to an embodiment of the present invention, a lighting direction of the second sub-pixel and a lighting direction of the first sub-pixel are same or substantially same.

In the display panel according to an embodiment of the present invention, a distance between the first surface and the bottom of the planarization layer is greater than a distance between the first end of the second surface and the bottom of the planarization layer.

In the display panel according to an embodiment of the present invention, the distance between the first end of the second surface and the bottom of the planarization layer gradually decreases in a direction from the first display portion to the second display portion.

In the display panel according to an embodiment of the present invention, a bottom of the openings in the second display portion is parallel or substantially parallel to a bottom of the openings in the first display portion.

In the display panel according to an embodiment of the present invention, in any adjacent ones of the openings in the second display portion, a width of the bottom of the openings defined close to the first display portion is greater than or equal to a width of the bottom of the openings defined away from the first display portion.

In the display panel according to an embodiment of the present invention, a surface of the anode layer away from the second surface is arranged in parallel with the second surface.

In an embodiment of the present invention further provides a method of manufacturing a display panel, the display panel including a first display portion and at least one second display portion, and the second display portion disposed on a side of the first display portion, wherein the method of manufacturing the display panel includes following steps:

step A, providing an array substrate;

step B, forming a planarization layer on the array substrate, wherein the planarization layer is disposed on the array substrate, the planarization layer positioned corresponding to the second display portion includes at least one inclined surface, the inclined surface includes a slope angle θ, where 0 degree <θ≤90 degrees;

step C, forming an anode layer on the planarization layer, wherein the anode layer is electrically connected to a thin film transistor of the array substrate through a via penetrating the planarization layer;

step D, forming a pixel definition layer on the planarization layer, wherein the pixel definition layer includes a plurality of openings, and positions of the openings correspond to positions of the anode layer;

step E, forming a light-emitting layer in the openings;

step F, forming a cathode layer on the light-emitting layer;

step G, forming an encapsulation layer on the cathode layer; and step H, bending or folding the second display portion to form the display panel.

In the method of manufacturing the display panel according to an embodiment of the present invention, the first display portion is a flat display portion, and the second display portion is a curved display portion or an inclined display portion having an included angle with the flat display portion.

In the method of manufacturing the display panel according to an embodiment of the present invention, the step B includes:

step b11, coating an organic material on the array substrate to form an organic material layer;

step b12, forming a photoresist layer on the organic material layer;

step b13, irradiating a mask plate with ultraviolet light, wherein the mask plate includes a transmitting region and a non-transmitting region, and a light transmittance of the transmitting region gradually decreases in a horizontal direction from the first display portion to the second display portion;

step b14, removing the photoresist layer positioned corresponding to the transmitting region;

step b15, etching the organic material layer positioned corresponding to the transmitting region; and step b16, peeling off the photoresist layer positioned corresponding to the non-transmitting region to form the planarization layer.

In the method of manufacturing the display panel according to an embodiment of the present invention, the planarization layer positioned corresponding to the second display portion includes a plurality of the inclined surfaces, the slope angle of the inclined surfaces gradually increases in a horizontal direction from the first display portion to the second display portion.

In the method of manufacturing the display panel according to an embodiment of the present invention, an included angle of the openings gradually decreases in a horizontal direction from the first display portion to the second display portion.

In the method of manufacturing the display panel according to an embodiment of the present invention, each of the second display portion is positioned on both sides of the first display portion.

Beneficial Effect

The embodiment of the present invention provides a display panel and a method of manufacturing same. In the display panel provided by the embodiment of the present invention, a distance between the first end of the second surface of the planarization layer of the second display portion arranged close to the first display portion and the bottom of the planarization layer is greater than a distance between the second end arranged away from of the first display portion and the bottom of the planarization layer, so that the second surface of the planarization layer corresponding to the second display portion is arranged parallel or substantially parallel to the first surface of the planarization layer corresponding to the first display portion. Therefore, the light emitted by the second sub-pixel is parallel to the light emitted by the first sub-pixel, to alleviate a problem of color shift between the first display portion and the second display portion caused by different viewing angles.

DESCRIPTION OF SPECIFIC EMBODIMENTS OF THE INVENTION

Figure 1:
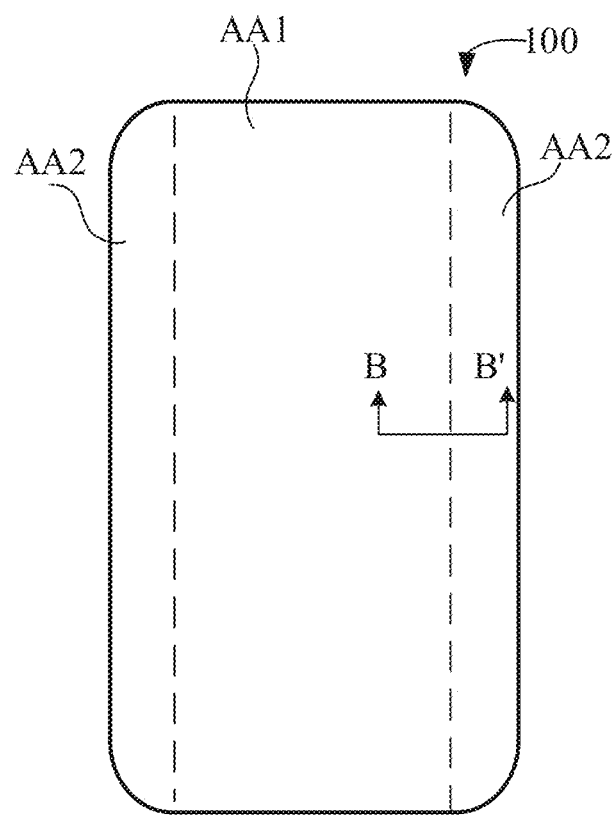
FIG. 1 is a top view of a display panel according to an embodiment of the present invention.

In order to make the objectives, technical solutions, and advantages of the present invention in a clearer manner, the present invention will be further described in detail below in conjunction with the accompanying drawings. Please refer to the drawings in the accompanying drawings, where the same component symbols represent the same components. The following description is based on the specific embodiments of the present invention shown, they should not be regarded as limiting other specific embodiments of the present invention that are not detailed here. The term "embodiment" used in the present specification means an example, example, or illustration.

In the description of the present invention, it is to be understood that the terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the description of the present application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in the present application can be understood according to specific situations.

Figure 2:
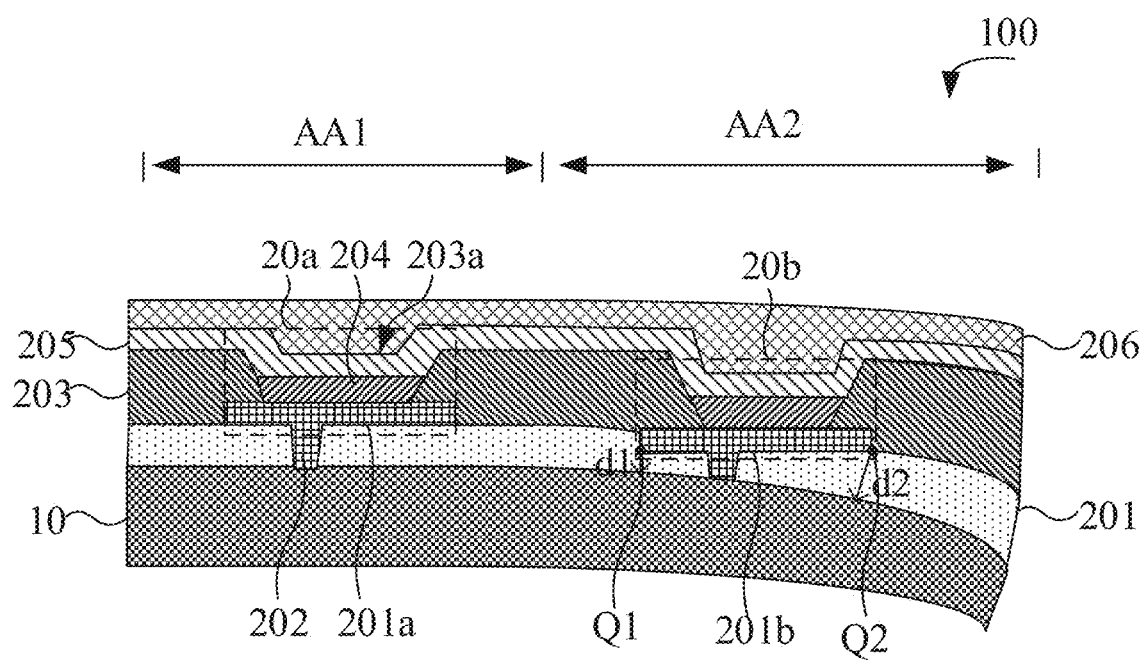
FIG. 2 is a cross-sectional view taken along A-A' of FIG. 1.

Refer to FIG. 1 and FIG. 2, an embodiment of the present invention provides a display panel, in which FIG. 1 is a top view of the display panel according to an embodiment of the present invention, and FIG. 2 is a cross-sectional view taken along A-A' of FIG. 1. The display panel 100 includes a first display portion AA1 and at least one second display portion AA2, and the second display portion AA2 is disposed on at least one side of the first display portion AA1. Wherein, the first display portion AA1 is a flat display portion, and the second display portion AA2 is a curved display portion or an inclined display portion having an included angle with the flat display portion. The display panel 100 further includes an array substrate 10, a planarization layer 201, an anode layer 202, a pixel definition layer 203, a light-emitting layer 204, a cathode layer 205, and an encapsulation layer 206.

Figure 3:
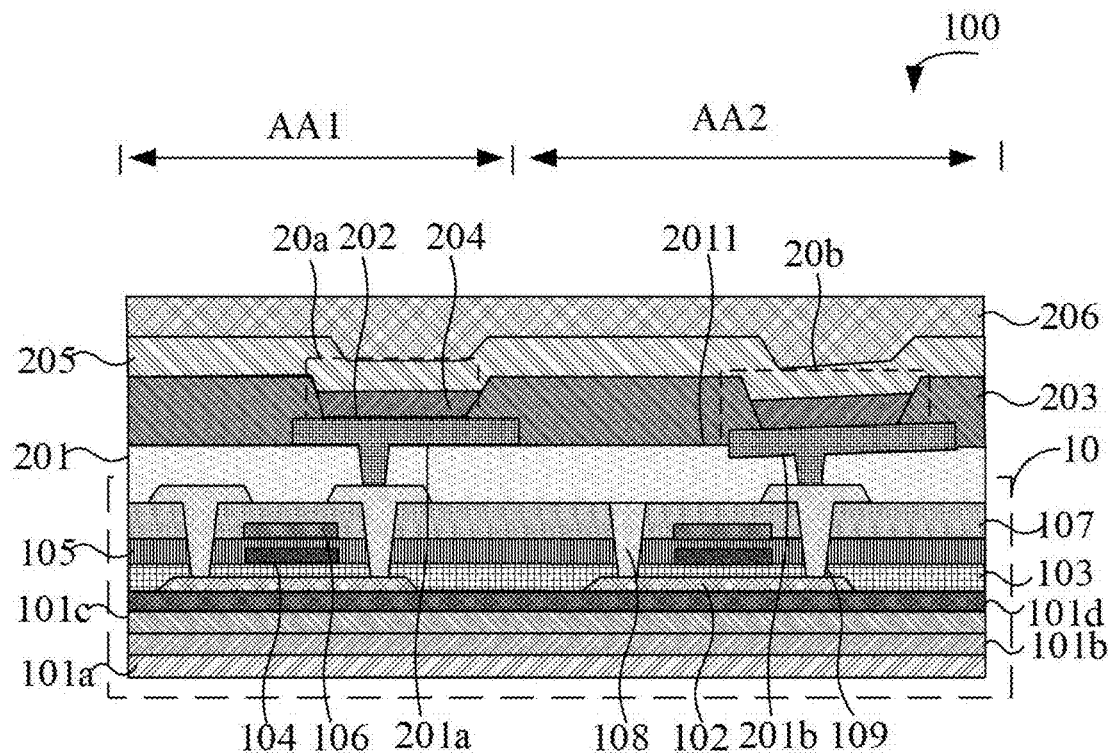
FIG. 3 is a cross-sectional view of the display panel before a second display portion is bent.

Specifically, refer to FIG. 3, which is a cross-sectional view of the display panel before the second display portion is bent. The array substrate 10 includes a plurality of thin film transistors, each of the thin film transistors includes an active layer 102, a first gate 104, a second gate 106, a source 108, and a drain 109, and the source 108 and the drain 109 are electrically connected to the active layer 102, respectively. The array substrate 10 further includes a first flexible substrate 101a, a barrier layer 101b, a second flexible substrate 101c, and a buffer layer 101d which are stacked in sequence. The active layer 102 is disposed on the buffer layer 101d. The array substrate 10 further includes a first gate insulating layer 103, a second gate insulating layer 105, and an interlayer dielectric layer 107. Wherein, the first gate insulating layer 103 covers the active layer 102 and the buffer layer 101d, and the first gate 104 is disposed on the first gate insulating layer 103. The second gate insulating layer 105 covers the first gate 104 and the first gate insulating layer 103. The interlayer dielectric layer 107 covers the second gate 106 and the second gate insulating layer 105. It should be noted that the thin film transistors in the array substrate in the embodiment of the present invention can also be a thin film transistor having a first gate, an active layer, a source, and a drain, that is, a structure of the array substrate 10 can be set according to actual conditions.

Refer to FIG. 2, the planarization layer 201 is disposed on the array substrate 10, and the planarization layer 201 includes a first surface 201a and a second surface 201b. The second surface 201b of the planarization layer 201 has a first end Q1 arranged close to the first display portion AA1 and a second end Q2 arranged away from the first display portion AA1. A distance d1 between the first end Q1 and a bottom of the planarization layer 201 is less than a distance d2 between the second end Q2 and the bottom of the planarization layer 201. Wherein, the first surface 201a is a surface of a portion where the planarization layer 201 correspond to a first sub-pixel 20a in the first display portion AA1, and the second surface 201b is a surface of a portion where the planarization layer 201 corresponds to a second sub-pixel 20b in the second display portion AA2. It should be noted that the first sub-pixel 20a and the second sub-pixel 20b in the embodiment of the present invention are positioned corresponding to the anode layer 202, the light-emitting layer 204, and the cathode layer 205 disposed in an opening 203a of the pixel definition layer 203. In the present embodiment, a lighting direction of the second sub-pixel 20b and a lighting direction of the first sub-pixel 20a are same or substantially same. That is, the light emitted from the second sub-pixel 20b positioned in the second display portion AA2 is perpendicular to the first surface 201a of the planarization layer 201, so as to alleviate a problem of color shift between the first display portion AA1 and the second display portion AA2 caused by different viewing angles. It should be noted that the planarization layer 201 in the present invention includes a plurality of second surfaces 201b, and FIG. 2 is only an example.

A distribution density of the first sub-pixel 20a projected on a plane corresponding to the first display portion AA1 is equal to or substantially equal to a distribution density of the second sub-pixel 20b projected on the plane corresponding to the first display portion AA1. Such kind of arrangement can effectively balance display effects between the first display portion AA1 and the second display portion AA2, so that the display effects of the first display portion AA1 and the second display portion AA2 are consistent.

Figure 4:
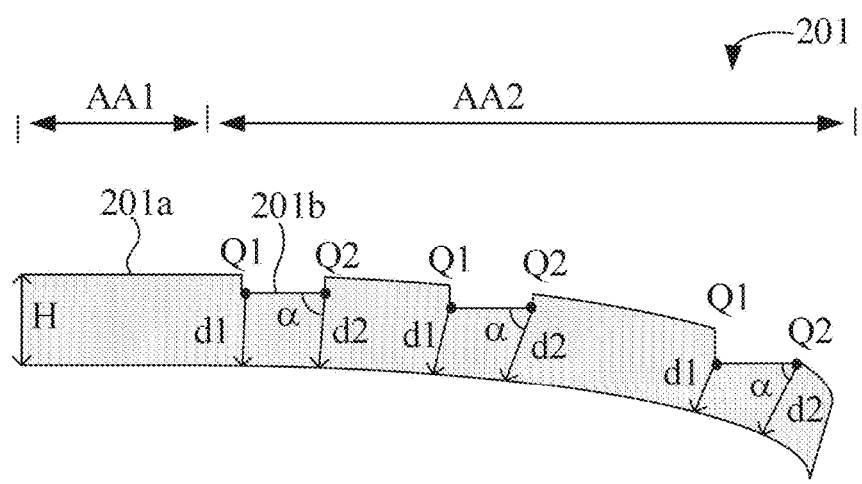
FIG. 4 is a schematic diagram of a planarization layer of the display panel according to an embodiment of the present invention.

Refer to FIG. 4, the planarization layer 201 includes a plurality of second surfaces 201b, and each of the second sub-pixel is correspondingly disposed on any second surface 2011. The second surface 201b is arranged parallel or substantially parallel to the first surface 201a. It should be noted that the second surface 201b and the first surface 201a in the embodiment of the present invention are substantially in parallel to each other, indicating that a value range of an included angle formed by the second surface 201b and a plane where the first surface 201a is positioned is less than 10 degrees. In addition, a straight line passing through the second end Q2 and defined perpendicular to the bottom of the planarization layer 201 has an included angle α with the second surface 201b. Specifically, a value range of the included angle α ranges between 0 degree (excluding 0 degree) and 90 degrees (including 90 degrees). For example, the included angle α can be any one of 0.1 degrees, 5 degrees, 10 degrees, 20 degrees, 30 degrees, 40 degrees, 50 degrees. 60 degrees, 70 degrees, 80 degrees, or 89 degrees. The included angle α gradually decreases in a direction from the first display portion AA1 to the second display portion AA2. Optionally, a difference between any adjacent two of the included angles α is less than 30 degrees. Furthermore, a distance H between the first surface 201a and the bottom of the planarization layer 201 is greater than the distance d1 between the first end Q1 of the second surface 201b and the bottom of the planarization layer 201. In the direction from the first display portion AA1 to the second display portion AA2, the distance d1 between the first end Q1 and the bottom of the planarization layer 201 gradually decreases and the second surface 201b is arranged in a stepwise decreasing order.

Refer to FIG. 2 or FIG. 3, the anode layer 202 is disposed on the first surface 201a and the second surface 201b of the planarization layer 201, and is electrically connected to the thin film transistors of the array substrate 10 through vias penetrating the planarization layer 201. A surface of the anode layer 202 away from the second surface 201b is arranged parallel to the second surface 201b.

The pixel definition layer 203 is disposed on the planarization layer 201, the pixel definition layer 203 has a plurality of openings 203a, and positions of the openings 203a correspond to a position of the anode layer 202.

Figure 5:
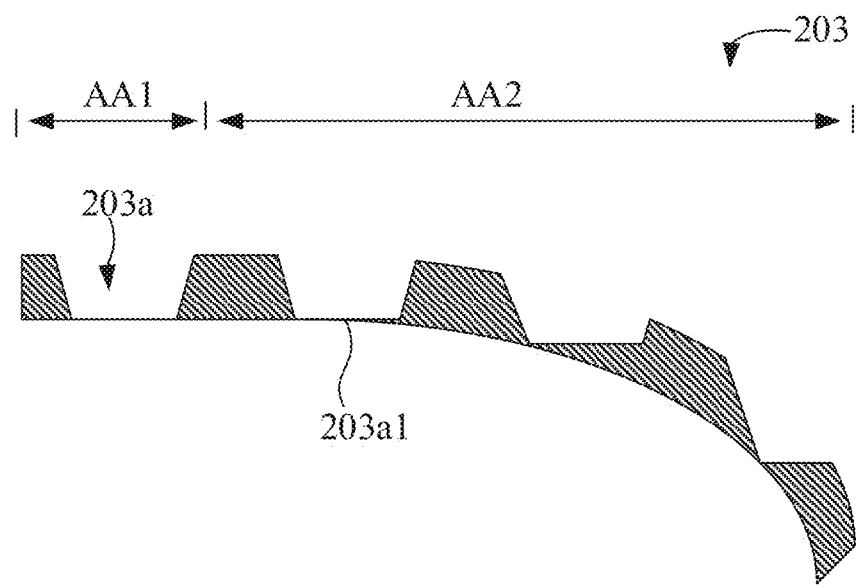
FIG. 5 is a schematic diagram of a display pixel definition layer of the display panel according to an embodiment of the present invention.

Refer to FIG. 5, a bottom 203a1 of the opening 203a in the second display portion AA2 is parallel or substantially parallel to a bottom 203a1 of the opening 203a in the first display portion AA1. Also, a width of the bottom of the opening 203a is less than a width of a top of the opening 203a. In adjacent two openings 203a in the second display portion AA2, the width of the bottom 203a1 of the openings 203a defined close to the first display portion AA1 is greater than or equal to the width of the bottom 203a1 of the openings 203a defined away from the first display portion AA1.

Figure 6:
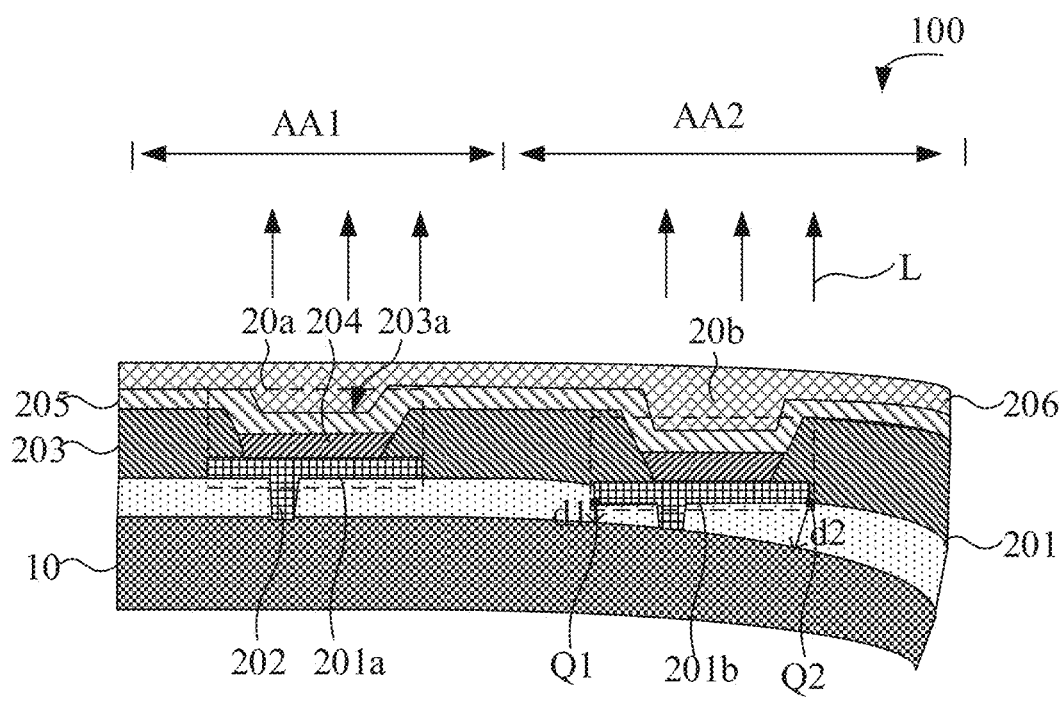
FIG. 6 is a schematic diagram of a lighting direction of the display panel according to an embodiment of the present invention.

Refer to FIG. 6, the light-emitting layer 204 is disposed in the openings 203a. The light-emitting layer 204 includes a light-exiting surface, and light L emitted from the light-exiting surface of the light-emitting layer 204 positioned in the second display portion AA2 is parallel to light emitted from the light-exiting surface of the light-emitting layer 204 positioned in the first display portion AA1. In the embodiment of the present invention, the planarization layer 201 is configured as a slope structure with different slope angles, so that a light-emitting angle of the light-emitting layer 204 of the second display portion AA2 after bending is same as a light-emitting angle of the light-emitting layer 204 of the first display portion AA1, so as to alleviate the problem of color shift between the curved display portion and the flat display portion caused by different viewing angles.

The cathode layer 205 covers the pixel definition layer 203 and the light-emitting layer 204. The encapsulation layer 206 is disposed on the cathode layer 205.

Figure 7:
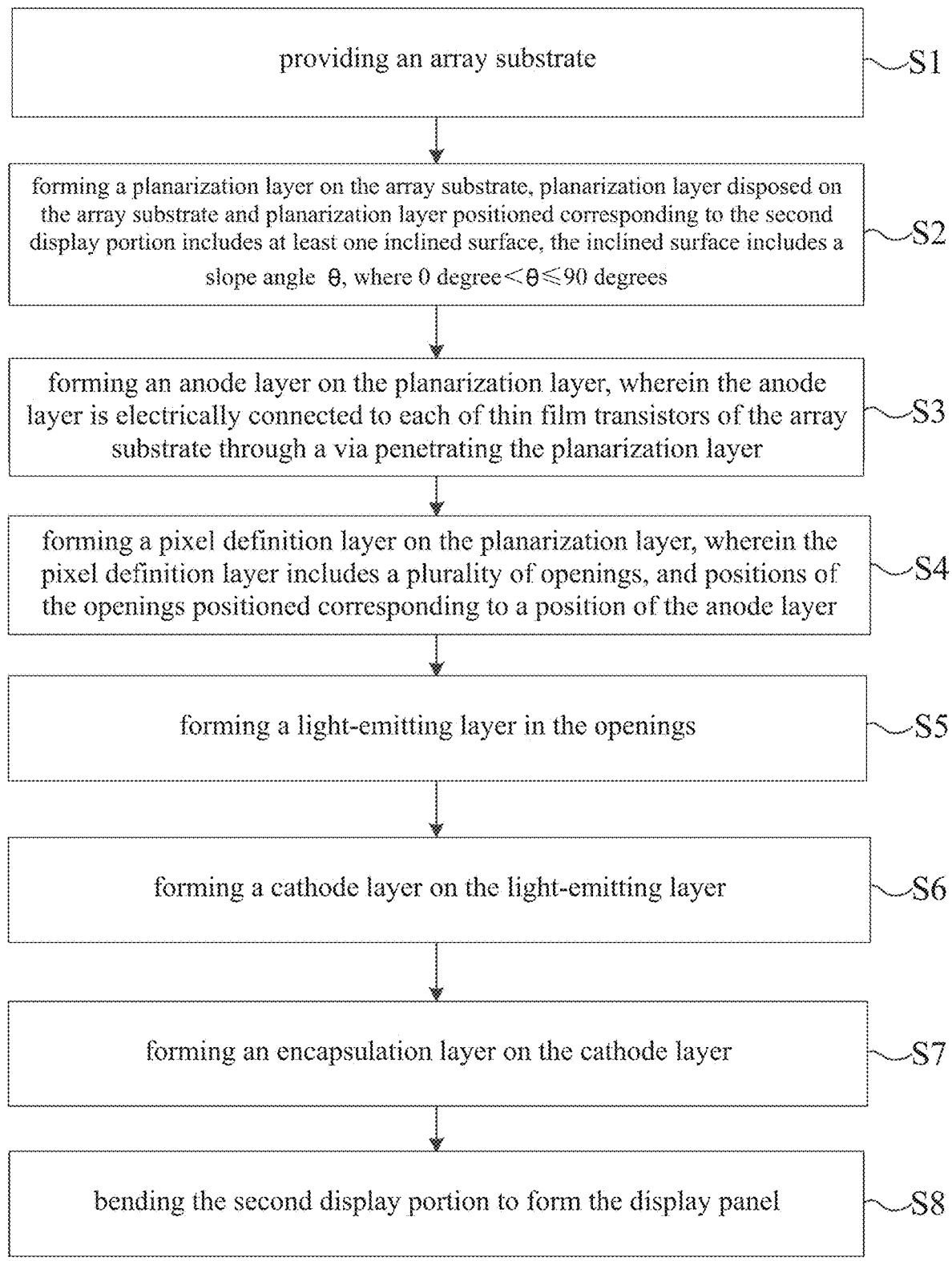
FIG. 7 and FIG. 8 are flow charts of steps of a method of manufacturing a display panel according to an embodiment of the present invention.

Refer to FIG. 2 and FIG. 7, an embodiment of the present invention further provides a method of manufacturing a display panel. The display panel 100 includes the first display portion AA1 and at least one second display portion AA2. The second display portion AA2 is disposed on at least one side of the first display portion AA1. The method of manufacturing the display panel 100 includes following steps.

Figure 9:
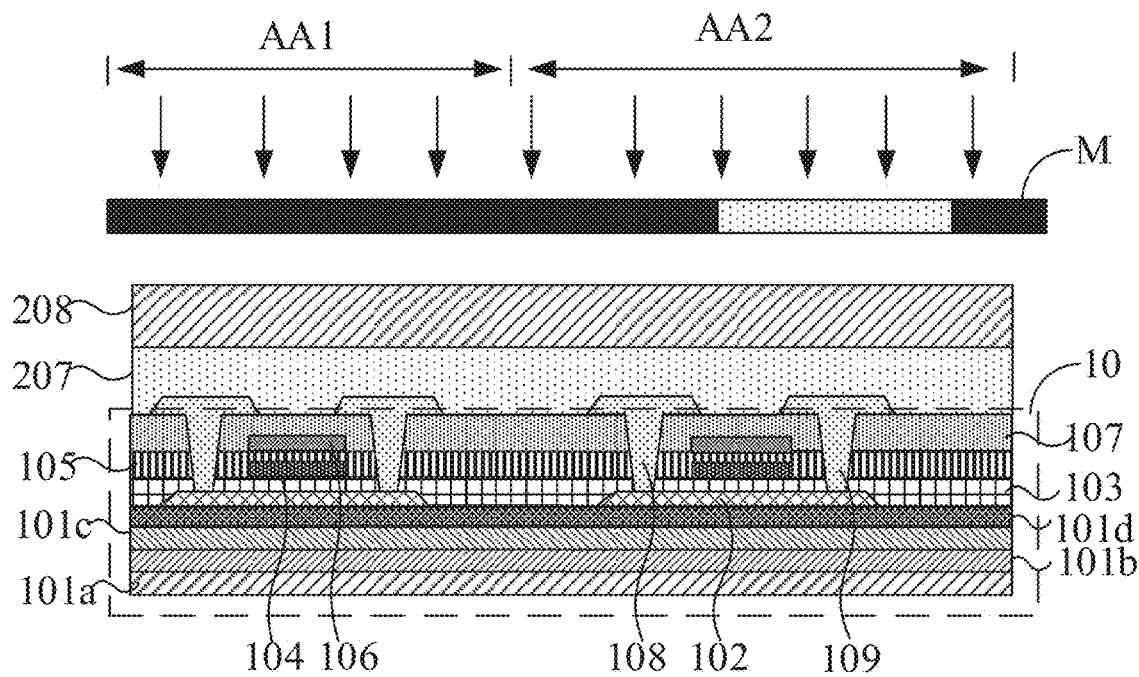
FIG. 9 and FIG. 10 are schematic diagrams of the method of manufacturing the display panel according to an embodiment of the present invention.

Step S1, refer to FIG. 9, providing an array substrate 10.

Wherein, the array substrate 10 includes thin film transistors. Each of the thin film transistors includes an active layer 102, a first gate 104, a second gate 106, a source 108, and a drain 109. The source 108 and the drain 109 are electrically connected to the active layer 102, respectively. The array substrate 10 further includes a first flexible substrate 101a, a barrier layer 101b, a second flexible substrate 101c, and a buffer layer 101d which are stacked in sequence. The active layer 102 is disposed on the buffer layer 101d. The array substrate 10 further includes a first gate insulating layer 103, a second gate insulating layer 105, and an interlayer dielectric layer 107. Wherein, the first gate insulating layer 103 covers the active layer 102 and the buffer layer 101d, and the first gate 104 is disposed on the first gate insulating layer 103. The second gate insulating layer 105 covers the first gate 104 and the first gate insulating layer 103. The interlayer dielectric layer 107 covers the second gate 106 and the second gate insulating layer 105. It should be noted that the thin film transistor in the array substrate in the embodiment of the present invention can also be a thin film transistor having a first gate, an active layer, a source, and a drain structure, that is, a structure of the array substrate 10 can be set according to actual conditions. A method of manufacturing the array substrate 10 can be conventional technical means, and will not be repeated here.

Step S2, forming a planarization layer 201 on the array substrate 10, The planarization layer 201 is disposed on the array substrate 10. The planarization layer 201 positioned corresponding to the second display portion AA2 includes at least one inclined surface 2011, the inclined surface 2011 includes a slope angle θ, where 0 degree <θ≤90 degrees, refer to FIG. 10.

Figure 8:
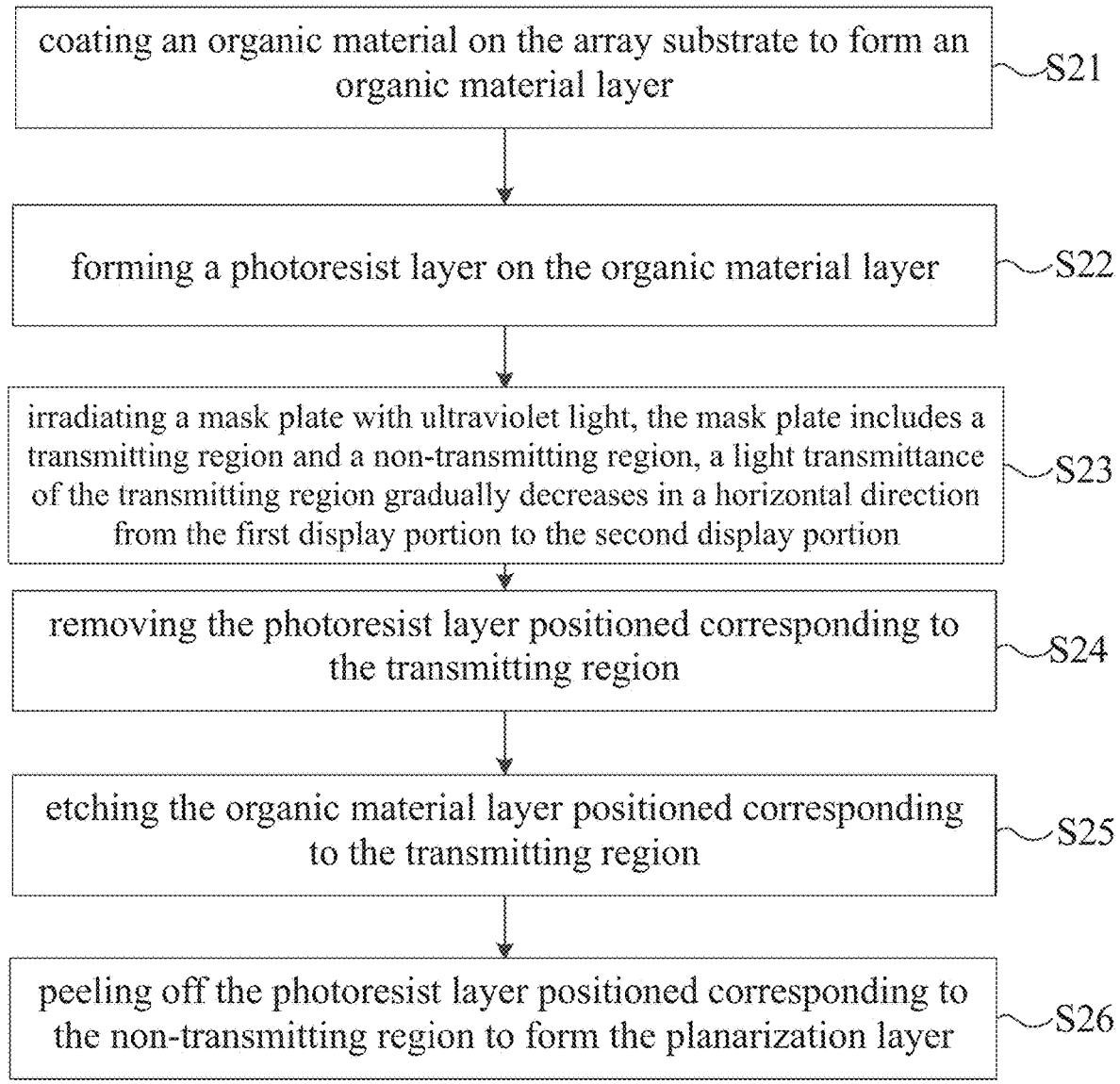

Specifically, refer to FIG. 8 and FIG. 9, the step S2 includes following:

Step S21, coating an organic material on the array substrate 10 to form an organic material layer 207.

Wherein, the organic material includes organic polymer material such as silane, acrylic, or epoxy.

Step S22, forming a photoresist layer 208 on the organic material layer 207.

Step S23, irradiating a mask plate M with ultraviolet light, wherein the mask plate M includes a transmitting region and a non-transmitting region, the non-transmitting region is disposed corresponding to the first display portion AA1, and the transmitting region is disposed corresponding to the second display portion AA2. A light transmittance of the transmitting region gradually decreases in a horizontal direction from the first display portion AA1 to the second display portion AA2.

Figure 10:
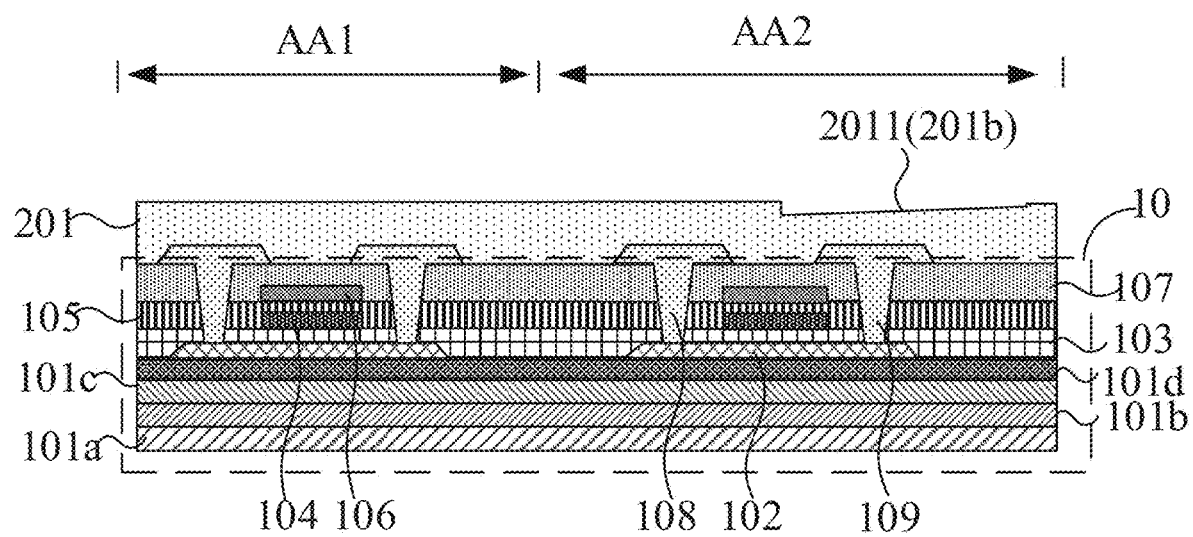

Step S24, refer to FIG. 9 and FIG. 10, removing the photoresist layer 208 positioned corresponding to the transmitting region.

Step S25, etching the organic material layer 207 positioned corresponding to the transmitting region.

Step S26, peeling off the photoresist layer 208 positioned corresponding to the non-transmitting region to form the planarization layer 201, refer to FIG. 10.

Step S3, refer to FIG. 3, forming an anode layer 202 on the planarization layer 201, wherein the anode layer 202 is electrically connected to each of thin film transistors of the array substrate 10 through a via penetrating the planarization layer 201.

Step S4, forming a pixel definition layer 203 on the planarization layer 201, wherein the pixel definition layer 203 includes a plurality of openings 203a, and positions of the openings 203a correspond to a position of the anode layer 202.

Step S5, forming a light-emitting layer 204 in the openings 203a.

Step S6, forming a cathode layer 205 on the light-emitting layer 204.

Step S7, forming an encapsulation layer 206 on the cathode layer 25.

Step S8, refer to FIG. 2, bending the second display portion AA2 to form the display panel 10. The inclined surface 2011 forms the second surface 201b by bending.

Figure 11:
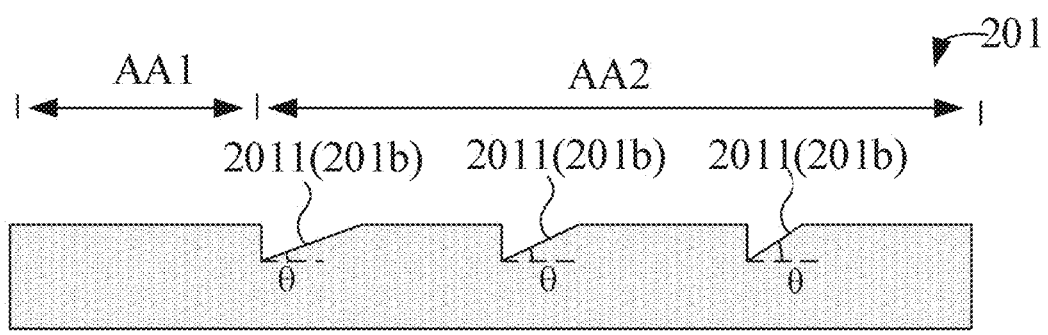
FIG. 11 is a schematic diagram of a planarization layer before bending in the method of manufacturing the display panel according to an embodiment of the present invention.

It should be noted that, refer to FIG. 11, in the embodiment of the present invention, the planarization layer 201 positioned corresponding to the second display portion AA2 has a plurality of inclined surfaces 2011. The inclined surfaces 2011 are arranged corresponding to a second sub-pixel, and the slope angle θ of the inclined surfaces is gradually increased. For example, the slope angle θ can be any one of 0.1 degree, 5 degrees, 10 degrees, 20 degrees, 30 degrees, 40 degrees, 50 degrees, 60 degrees, 70 degrees, 80 degrees, or 89 degrees.

Refer to FIG. 3, the anode layer 202 is disposed on the planarization layer 201, and is electrically connected to the array substrate 10 through the vias. A portion of the anode layer 202 positioned corresponding to the planarization layer 201 has same slope angle.

Figure 12:
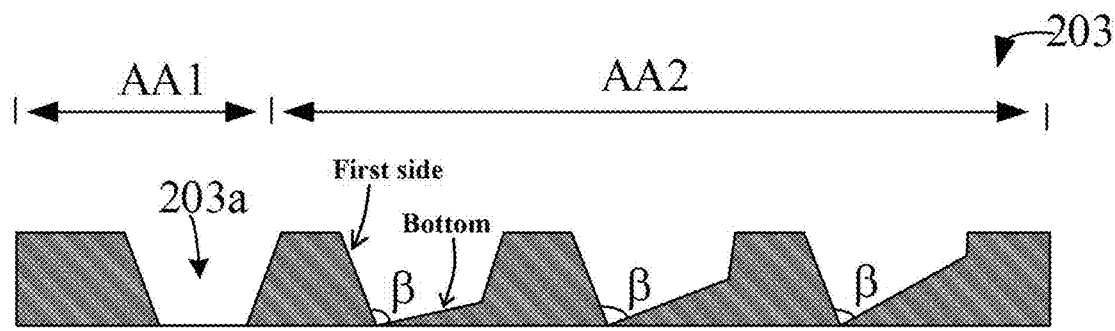
FIG. 12 is a schematic diagram of the pixel definition layer before bending in the method of manufacturing the display panel according to an embodiment of the present invention.

Refer to FIG. 3 and FIG. 12, FIG. 12 is a schematic diagram of a structure of the pixel definition layer before the display panel is bent. The pixel definition layer 203 is disposed on the planarization layer 201. The pixel definition layer 203 includes the openings 203a. The anode layer 202 is correspondingly disposed at the bottom of the openings 203a, and an included angle β of the openings 203a gradually decreases in a horizontal direction from the first display portion AA1 to the second display portion AA2.

The display panel according to the embodiment of the present invention is manufactured by the above-mentioned method of manufacturing the display panel.

Refer to FIG. 3, in the display panel and the manufacturing method thereof according to the embodiment of the present invention, a region where the first display portion AA1 is not bent is same as a design of a common substrate. However, in the second display portion AA2, the planarization layer 201 is designed with the inclined surfaces. Refer to FIG. 11, due to different edge curvatures, the slope angle of the inclined surfaces 2011 of the planarization layer 201 positioned away from the first display portion AA1 is greater than the slope angle of the inclined surfaces 2011 of the planarization layer 201 positioned close to the first display portion AA1. Such arrangement is used to compensate for a visual difference caused by a bending of a border, improve optical quality of the border the display panel, and improve core competitiveness of products, so that the products have a unique advantage in the market.

Specifically, in conjunction with FIG. 2 and FIG. 3, in the second display portion AA2, by designing different slope angles of the inclined surfaces at bottoms of pixel units of the array substrate 10 according to different bending radius after a module process to compensate for an optical difference caused by a bending of the second display portion AA2, the lighting direction of the second sub-pixel unit 20b after bending is same as the lighting direction of the first sub-pixel unit 20a.

First, a usage of halftone mask technology with different light transmittances realizes the planarization layer 201 with an angular tendency. According to curvature properties of the border of the display panel, the slope of the planarization layer 201 that is opposite to a bending direction after the module process is designed, and the slope angle ranges between 0 degree and 90 degrees, and is configured to compensate for a change of the lighting direction due to bending. Therefore, the lighting direction of the second display portion is same as the lighting direction of the first display portion.

Each of the pixel unit has a same slope angle in a same vertical direction, and its angle ranges between 0.1 degrees and 90 degrees. It should be noted that the specific required slope angle can be determined according to different designs to compensate for the change of the lighting direction due to bending.

Refer to FIG. 11, the slope angle of the inclined surfaces 2011 of the planarization layer 201 gradually increases in the horizontal direction from the first display portion to the second display portion.

Furthermore, each of the second display portion AA2 is positioned on both sides of the first display portion, and the second display portion has an axisymmetric structure. Alternatively, each of the second display portion is designed with four curved surfaces, and a curvature design is completed according to different curvature requirements.

Refer to FIG. 3, after designs of different slope angles of the planarization layer 201 are completed, the anode layer 202, the pixel definition layer 203, the light-emitting layer 204, the cathode layer 205, and the encapsulation layer 206 are sequentially disposed on the planarization layer 201. Wherein, materials of the anode layer 202 include silver, magnesium, indium tin oxide, or the like.

An arrangement of the second sub-pixels is same as an arrangement of the first sub-pixels, including a variety of specific pixel arrangement designs, such as slot type, delta type, and pentile type.

Dots of the pixel arrangement are regularly arranged according to the first sub-pixels of the first display portion AA1, and center points of the second pixels are arranged according to a certain design rule. An aperture size of each of the pixel unit can be compensated according to different slopes, moreover, designing with different aperture ratios so that the second display portion AA2 has a same light intensity and chromaticity as the first sub-pixel unit.

The embodiment of the present invention provides a display panel and a manufacturing method thereof. In the display panel according to the embodiment of the present invention, the distance between the first end of the second surface of the planarization layer of the second display portion arranged close to the first display portion and the bottom of the planarization layer is less than the distance between the second end arranged away from of the first display portion and the bottom of the planarization layer, so that the second surface of the planarization layer corresponding to the second display portion is arranged parallel or substantially parallel to the first surface of the planarization layer corresponding to the first display portion. Therefore, the light emitted by the second sub-pixel is parallel to the light emitted by the first sub-pixel, to alleviate a problem of color shift between the first display portion and the second display portion caused by different viewing angles.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a first display portion and at least one second display portion, the second display portion disposed on at least one side of the first display portion, wherein the display panel further comprises:
an array substrate;
a planarization layer disposed on the array substrate, wherein the planarization layer comprises a plurality of first surfaces and a plurality of second surfaces, each of the plurality of second surfaces comprises a first end arranged close to the first display portion and a second end arranged away from of the first display portion, a vertical distance between the first end and a bottom of the planarization layer is less than a vertical distance between the second end and the bottom of the planarization layer, the first surface is a surface of a portion where the planarization layer corresponds to one of a plurality of first sub-pixels in the first display portion, and each of the plurality of second surfaces is a surface of a portion where the planarization layer corresponds to one of a plurality of second sub-pixels in the second display portion;
an anode layer disposed on the plurality of first surfaces and the plurality of second surfaces of the planarization layer;
a pixel definition layer disposed on the planarization layer, wherein the pixel definition layer comprises a plurality of openings, and positions of the openings correspond to a position of the anode layer;
a light-emitting layer disposed in each of the plurality of openings;
a cathode layer covering the pixel definition layer and the light-emitting layer; and
an encapsulation layer disposed on the cathode layer;
wherein vertical distances between the first ends of the plurality of second surfaces and the bottom of the planarization layer gradually decrease as distance between the plurality of second sub-pixels and the plurality of first sub-pixels increases.

2. The display panel according to claim 1, wherein the first display portion is a flat display portion, and the second display portion is a curved display portion.

3. The display panel according to claim 1, wherein a distribution density of the plurality of first sub-pixels projected on a plane corresponding to the first display portion is equal to or substantially equal to a distribution density of the plurality of second sub-pixels projected on the plane corresponding to the first display portion.

4. The display panel according to claim 1, wherein the plurality of second surfaces is arranged parallel or substantially parallel to the first surface.

5. The display panel according to claim 4, wherein for each second surface, an included angle is formed between a straight line passing through the second end and being perpendicular to the bottom of the planarization layer and the second surface, and the included angles gradually decrease as distance between the plurality of second sub-pixels and the plurality of first sub-pixels increases.

6. The display panel according to claim 5, wherein the included angle is greater than 0 degree and less than or equal to 90 degrees.

7. The display panel according to claim 6, wherein a difference between any adjacent two of the plurality of included angles is less than 30 degrees.

8. The display panel according to claim 1, wherein the at least one second display portion comprises two second display portions, the two second display portions being positioned on opposing sides of the first display portion.

9. The display panel according to claim 1, wherein a lighting direction of the plurality of second sub-pixels and a lighting direction of the plurality of first sub-pixels are same or substantially same.

10. The display panel according to claim 1, wherein a bottom of the openings in the second display portion is parallel or substantially parallel to a bottom of the openings in the first display portion.

11. The display panel according to claim 10, wherein in any adjacent ones of the openings in the second display portion, a width of the bottom of the openings defined close to the first display portion is greater than or equal to a width of the bottom of the openings defined away from the first display portion.

12. The display panel according to claim 1, wherein a surface of the anode layer away from the second surface is arranged in parallel with the second surface.

13. A method of manufacturing a display panel, the display panel comprising a first display portion and at least one second display portion, and the second display portion disposed on at least one side of the first display portion, wherein the method of manufacturing the display panel comprises following steps:
step A, providing an array substrate;
step B, forming a planarization layer on the array substrate, wherein the planarization layer is disposed on the array substrate, the planarization layer positioned corresponding to the second display portion comprises at least one inclined surface, and the inclined surface comprises a slope angle $\theta$ formed between a bottom of the planarization layer and the inclined surface, where 0 degree $<\theta\leq 90$ degrees;
step C, forming an anode layer on the planarization layer, wherein the anode layer is electrically connected to a thin film transistor of the array substrate through a via penetrating the planarization layer;
step ID, forming a pixel definition layer on the planarization layer, wherein the pixel definition layer comprises a plurality of openings, and positions of the openings correspond to positions of the anode layer;
step E, forming a light-emitting layer in the openings;
step F, forming a cathode layer on the light-emitting layer;
step G, forming an encapsulation layer on the cathode layer; and
step H, bending or folding the second display portion to form the display panel;
wherein the step B comprises;
step b11, coating an organic material on the array substrate to form an organic material layer;
step b12, forming a photoresist layer on the organic material layer;
step b13, irradiating a mask plate with ultraviolet light, wherein the mask plate comprises a transmitting region and a non-transmitting region, and a light transmittance of the transmitting region gradually decreases in a horizontal direction with increasing distance from the first display portion;
step b14, removing the photoresist layer positioned corresponding to the transmitting region;
step b15, etching the organic material layer positioned corresponding to the transmitting region; and step b16, peeling off the photoresist layer positioned corresponding to the non-transmitting region to form the planarization layer.

14. The method of manufacturing the display panel according to claim 13, wherein the first display portion is a flat display portion, and the second display portion is a curved display portion or an inclined display portion.

15. The method of manufacturing the display panel according to claim 13, wherein the at least one inclined surface comprises a plurality of inclined surfaces, and the planarization layer positioned corresponding to the second display portion comprises the plurality of the inclined surfaces, and the slope angles of the inclined surfaces gradually increase in a horizontal direction with increasing distance from the first display portion.

16. The method of manufacturing the display panel according to claim 13, wherein each opening of the plurality of openings comprises an included angle, the included angle being formed between a first side of the opening and a bottom of the opening, and the included angles gradually decrease in a horizontal direction with increasing distance from the first display portion.

17. The method of manufacturing the display panel according to claim 13, wherein the at least one second display portion comprises two second display portions, the two second display portions being positioned on opposing sides of the first display portion.

* * * * *